United States Patent [19]

Siddall et al.

[11] Patent Number: 4,613,981
[45] Date of Patent: Sep. 23, 1986

[54] METHOD AND APPARATUS FOR LITHOGRAPHIC ROTATE AND REPEAT PROCESSING

[75] Inventors: Graham J. Siddall, Woodside; Steven G. Eaton, Palo Alto; James B. Kruger, Half Moon Bay; Garrett A. Garrettson, Los Altos Hills; Armand P. Neukermans, Palo Alto, all of Calif.

[73] Assignee: Varian Associates, Inc., Palo Alto, Calif.

[21] Appl. No.: 573,524

[22] Filed: Jan. 24, 1984

[51] Int. Cl.$^4$ .............................................. G21K 5/00
[52] U.S. Cl. ..................................... 378/34; 250/492.1
[58] Field of Search .......................... 378/34, 35, 205; 250/492.2, 491.1, 453.1

[56] References Cited

U.S. PATENT DOCUMENTS

| 3,181,419 | 5/1965 | Knaup et al. | 354/80 |
| 3,875,416 | 4/1975 | Spicer | 250/492.2 |
| 4,260,670 | 4/1981 | Burns | 378/34 |
| 4,385,238 | 5/1983 | Westerberg et al. | 250/492.2 |
| 4,430,571 | 2/1984 | Smith et al. | 250/492.2 |

Primary Examiner—Craig E. Church
Assistant Examiner—Charles Wieland
Attorney, Agent, or Firm—Stanley Z. Cole; William R. McClellan

[57] ABSTRACT

An X-ray lithography apparatus permits the successive exposure of each of four quadrants of a semiconductor wafer through a single mask. The mask overlays one quadrant of the wafer at a time and the wafer is rotated through 90 degrees after exposure of a quadrant to allow exposure of succeeding wafer quadrants; each wafer quadrant is independently aligned to the mask prior to exposure. In an alternative preferred embodiment, a rotatable diaphragm is used to select a single mask quadrant from a mask which overlays the entire surface of the semiconductor wafer. Both the wafer and the diaphragm may be rotated to allow various exposure combinations of mask and wafer quadrants.

18 Claims, 19 Drawing Figures

METHOD AND APPARATUS FOR LITHOGRAPHIC ROTATE AND REPEAT PROCESSING

BACKGROUND AND SUMMARY OF THE INVENTION

The major factor which limits the size of the exposed field in lithographic processing of a semiconductor wafer is the accuracy with which the wafer and a mask may be aligned. Since mask and wafer distortions increase with field size, alignment accuracy increases with decreasing field size. For this reason, sub-field optical and X-ray step-and-repeat exposure systems are commonly used in modern lithographic processing Unfortunately, both system complexity and die cost increase, and throughput decreases, as the number of sub-fields per wafer is increased. Thus, it is desirable to maximize the field size at a given level of alignment accuracy.

Even though alignment accuracy in modern X-ray lithographic systems has increased for relatively large field sizes, it is often impossible to achieve adequate alignment accuracy over the full wafer surface and sub-field exposure becomes necessary Step-and-repeat systems are used in optical lithography to step the wafer in an X- or Y-direction between exposures so that a relatively small field is repeatedly exposed on the wafer surface. Step-and-repeat systems typically require complex movement and alignment devices to accurately repeat the exposure pattern across the surface of the wafer.

In accordance with an illustrated preferred embodiment of the present invention, a rotate-and-repeat apparatus makes effective use of the increased size of the distortion-free field in modern X-ray lithographic systems. A semiconductor wafer is divided into four quadrants and a mask, having an active diameter which is smaller than that of the wafer, is aligned over one quadrant. After the first wafer quadrant is exposed through the mask the wafer is rotated in successive 90 degree increments and each of the other three quadrants is exposed through the mask. The use of rotational movement of the wafer, rather than linear movement, allows the rotate-and-repeat apparatus to be smaller and less complex than a corresponding step-and-repeat apparatus would be. Alignment of the mask and the wafer in the rotate-and-repeat apparatus may be achieved with capacitive aligners as shown in the copending Neukermans et al U.S. patent application Ser. No. 541,385, which is incorporated herein by reference.

In accordance with another illustrated preferred embodiment of the present invention, a rotatable diaphragm is positioned between a radiation source and the mask. The wafer, mask and diaphragm are all of substantially the same diameter and are all divided into quadrants. Use of one or more diaphragm transmissive quadrants and rotation of the diaphragm and wafer allows selective exposure of the wafer quadrants.

DETAILED DESCRIPTION OF THE PREFERRED EMBODIMENT

Figure 1:
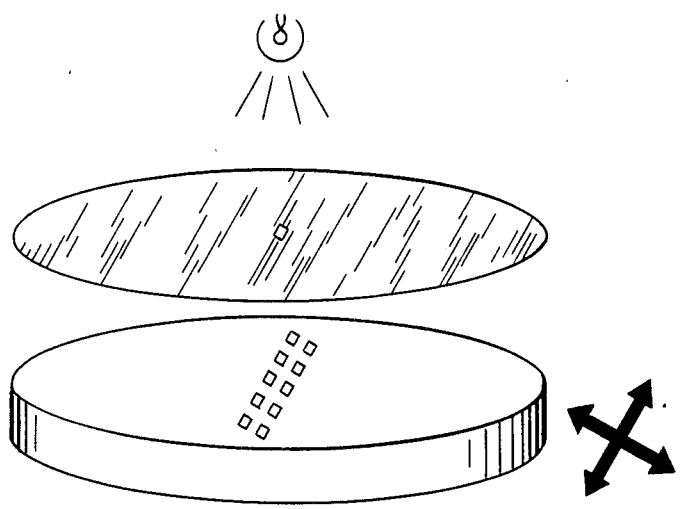
FIG. 1 shows a prior art step-and-repeat exposure system.

FIG. 1 shows a prior art step-and-repeat exposure apparatus in which the wafer is linearly stepped in either the X- or Y-axis between exposures.

Figure 2:
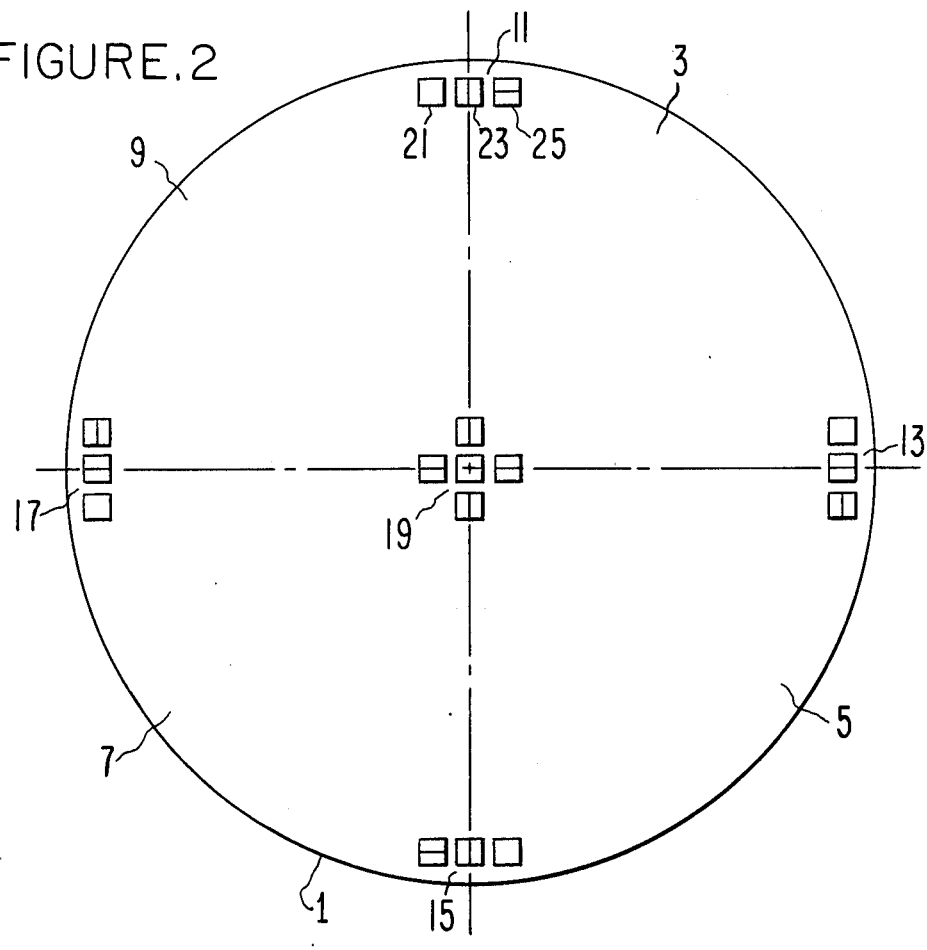
FIG. 2 shows a four quadrant semiconductor wafer which is used in the preferred embodiment of the present invention.

FIG. 2 shows a semiconductor wafer 1 which is divided into four quadrants 3, 5, 7, 9. Four sets of alignment marks 11, 13, 15, 17 are located at the edge of wafer 1 at 90 degree intervals. Each set of alignment marks includes an X-axis mark 23 and a Y-axis mark 25 for alignment in the X- and Y-axes. Marks 23 and 25 may be of the capacitive alignment type disclosed in the above-referenced Neukermans et al U.S. patent application. Also included is a Z-axis alignment mark 21 for establishing the absolute gap between wafer 1 and a mask. Mark 21 may be a capacitive pad for detection of the absolute capacitance between wafer 1 and the mask. An optional set of central alignment marks 19 is located at the center of wafer 1. It should be noted that the presence of mark set 19 does not affect the application of a photoresist layer to wafer 1 since the photoresist droplet may be applied radially beyond the mark set 19.

Figure 3:
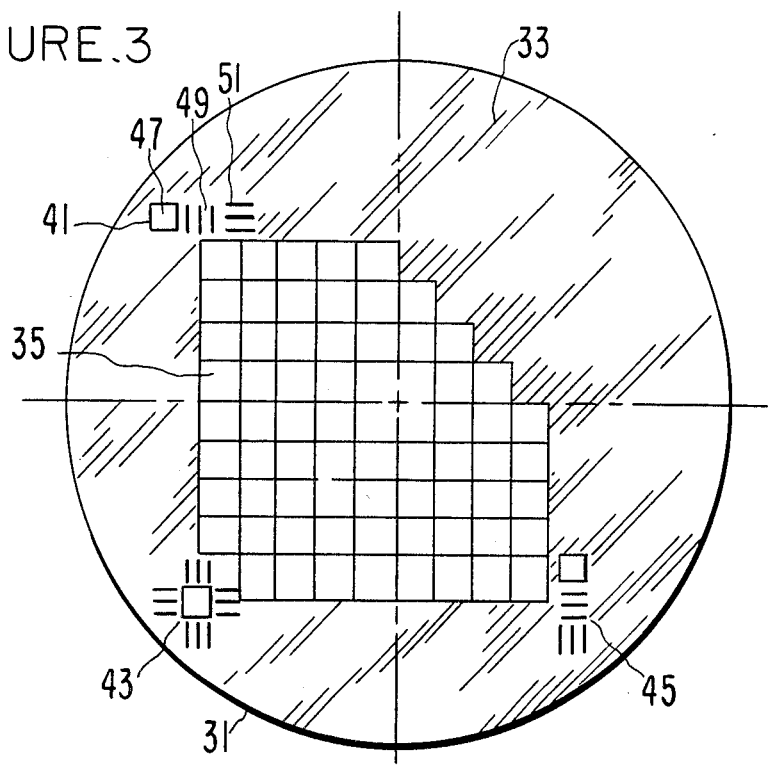
FIG. 3 shows a mask which is used in the preferred embodiment of the present invention.

FIG. 3 shows a mask 31 which is used in conjunction with wafer 1 in the preferred embodiment of the present invention. Mask 31 should be constructed using any of a number of techniques which are well known in the X-ray lithography art. Mask 31 may have a diameter which is smaller than the diameter of wafer 1, but mask 31 must be sufficiently large to cover at least one of the quadrants of wafer 1. Mask 31 comprises a block 33 which is non-transmissive to the radiation source used and an exposure section 35 which contains a pattern which is to be lithographed onto one of the quadrants of wafer 1. Mask 31 also comprises alignment mark sets 41 and 45 having Z-axis mark 47, X-axis mark 49 and Y-axis mark 51, which operate in conjunction with mark sets 11, 13, 15, 17 of wafer 1 to align mask 31 with wafer 1 in all three axes. Optional central mark set 43 allows for alignment in conjunction with central mark set 19 of wafer 1.

Figure 4:
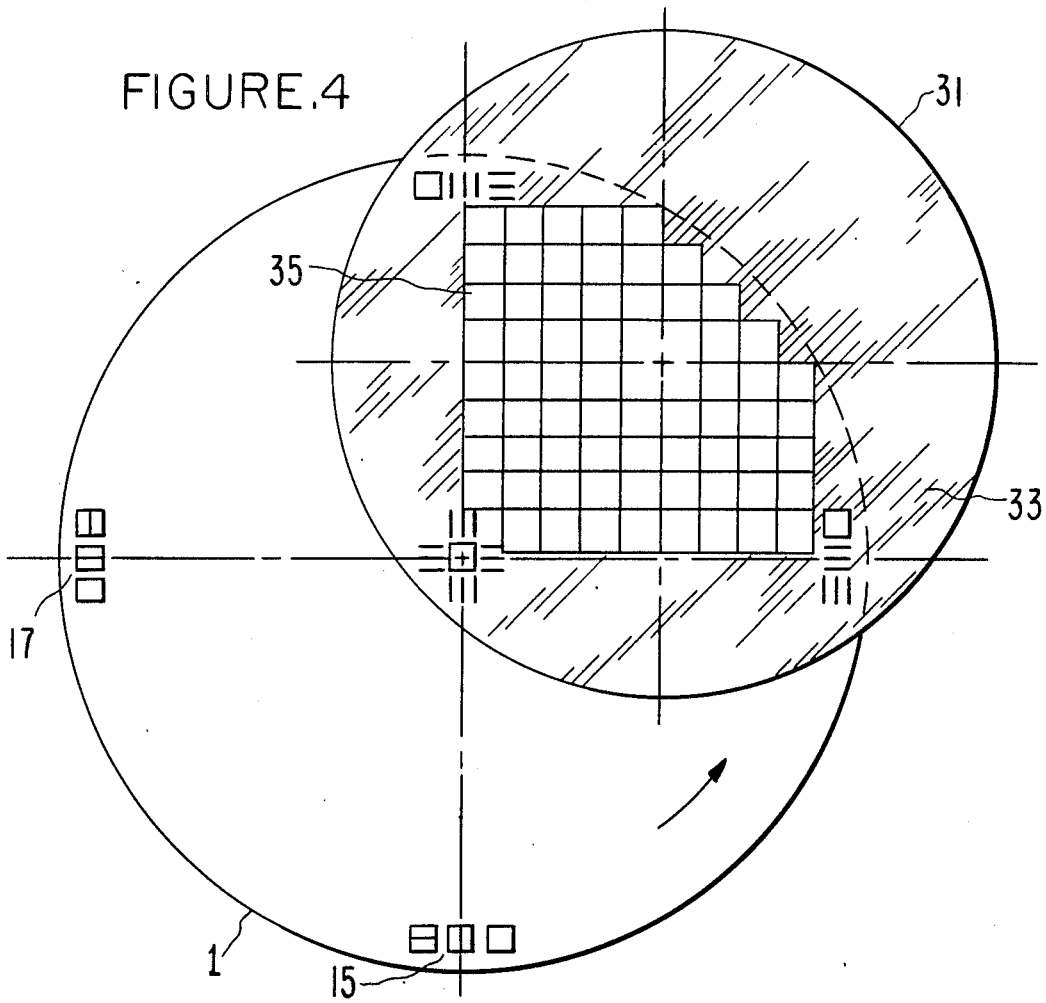
FIGS. 4 and 5 show an apparatus which is constructed in accordance with a preferred embodiment of the present invention utilizing the mask and wafer shown in FIGS. 1 and 2.
Figure 5:
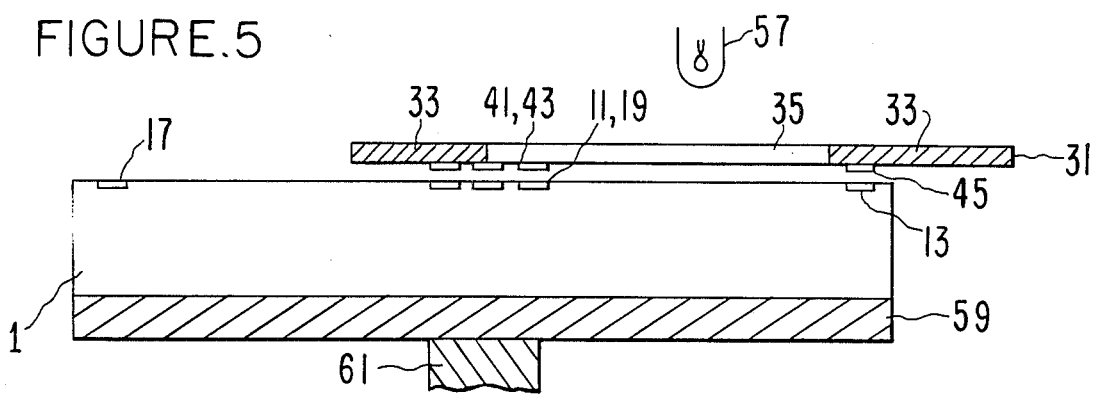

FIGS. 4 and 5 show a preferred embodiment of the rotate-and-repeat apparatus. Mask 31 overlays wafer 1 and a radiation source 57 exposes a photoresist layer on the first quadrant 3 through the exposure section 35 of mask 31. The block 33 shields the remainder of wafer 1 from exposure by source 57. Alignment mark sets 11 and 41 and mark sets 13 and 45 are used to align mask 31 and wafer 1 and central mark sets 19 and 43 may be used to achieve tighter alignment as desired. After quadrant 3 is exposed, the wafer 1 is rotated through 90 degrees by chuck 59 and spindle 61 and mask 31 is aligned over quadrant 5 by the use of mark sets 13 and 41 and mark sets 15 and 45 (and central mark sets 19 and 43 if desired). After quadrant 5 is exposed, the rotate-and-repeat sequence is repeated until all four quadrants 3, 5, 7 and 9 are exposed.

Figure 6:
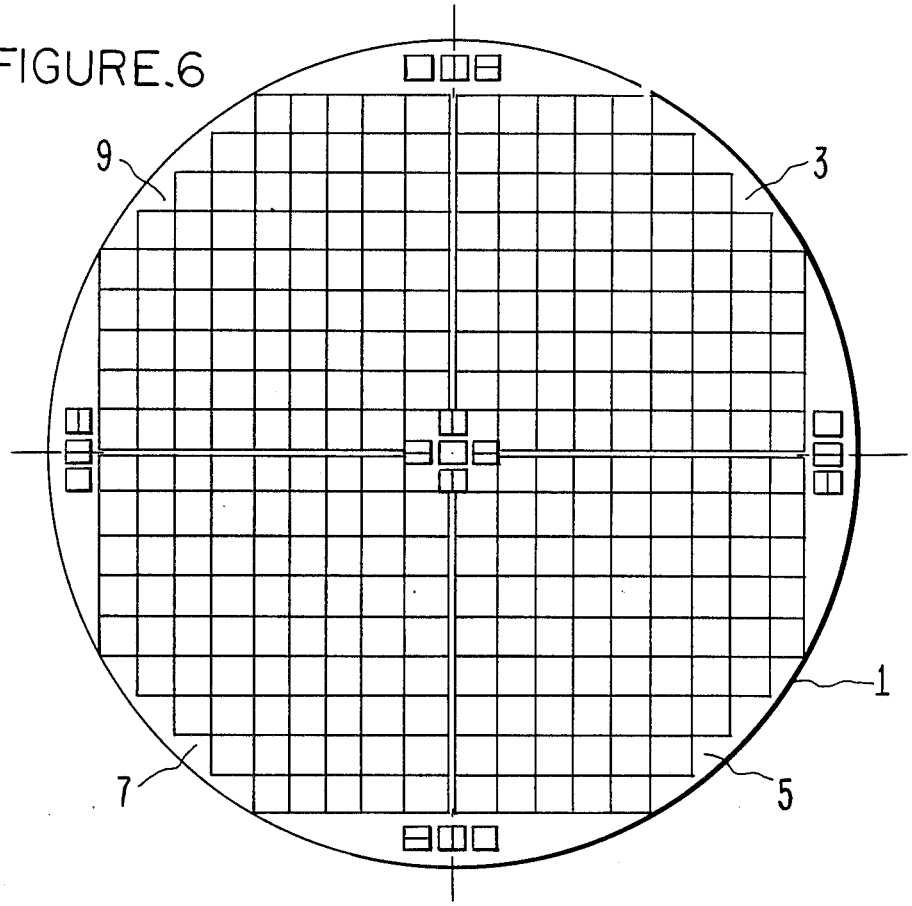
FIG. 6 shows a wafer after exposure in the apparatus shown in FIGS. 4 and 5.

FIG. 6 shows wafer 1 after exposure of all four quadrants is accomplished as described above. Because of the repeated 90 degree rotations, the dice contained in each quadrant are rotated 90 degrees from the dice in adjacent quadrants.

Figure 7:
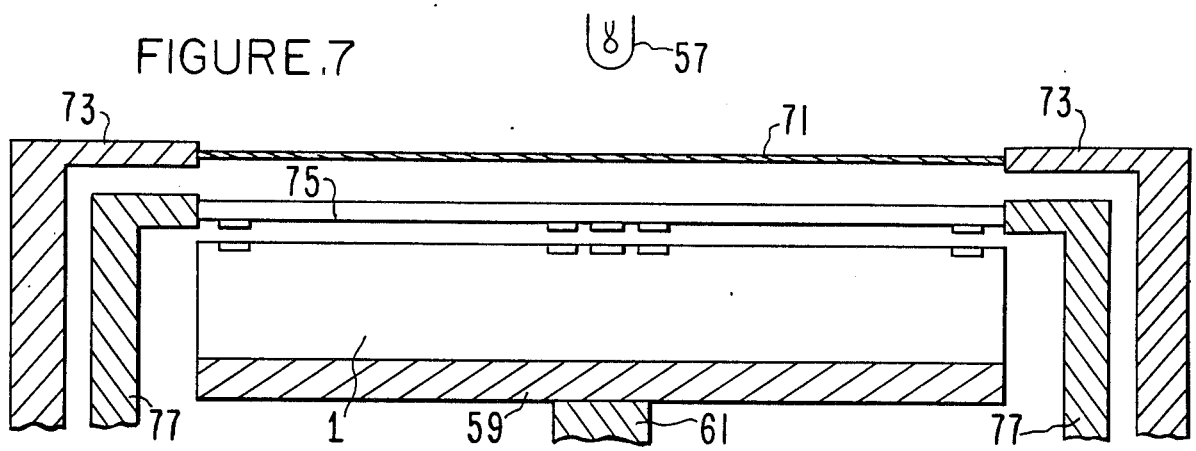
FIG. 7 shows an alternative preferred embodiment of the present invention in which a rotatable diaphragm is used.
Figure 8:
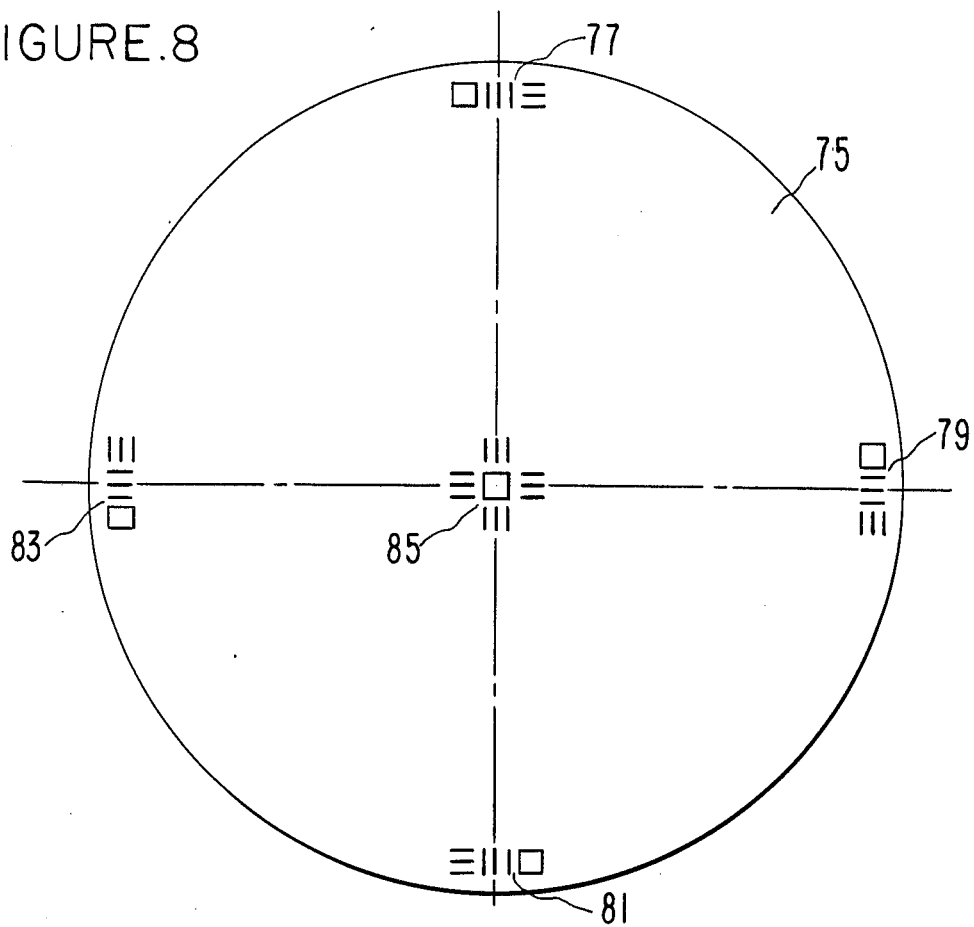
FIG. 8 shows the mask used in the apparatus shown in FIG. 7.

FIG. 7 shows an alternative preferred embodiment of the present invention in which a single alignment axis is used. A diaphragm 71, located between source 57 and mask 75, allows selective exposure of a quadrant of wafer 1. Diaphragm 71, shown in FIG. 9, includes a transmissive portion 82 and a non-transmissive portion 80. Diaphragm 71 is supported in a frame 73 which allows selective rotation of the diaphragm 71. Mask 75 has a diameter sufficient to allow coverage of the entire surface of wafer 1 and is supported in a frame 77. Mask 75 shown in FIG. 8, has five sets of alignment marks 77–83 of the type discussed above to permit alignment to wafer 1. Mask 75 is divided into four quadrants, each of which may have a different exposure pattern located thereon.

The apparatus shown in FIG. 7 may be used with the diaphragm 71 removed to provide conventional full field exposure. This may be appropriate in the less critical mask levels of wafer 1.

The apparatus shown in FIG. 7 may be used without the diaphragm 71 and with the mask 75 having the same pattern, rotated by 90 degrees, repeated in each of the four quadrants. The whole surface of wafer 1 is exposed in one of the four possible mask 75 orientations and is then rotated, aligned and exposed until each of the four possible orientations has been exposed. If one quarter of the total required exposure time is used for each exposure, the deleterious effect of a defect on any particular quadrant of the mask is diminished.

Figure 9:
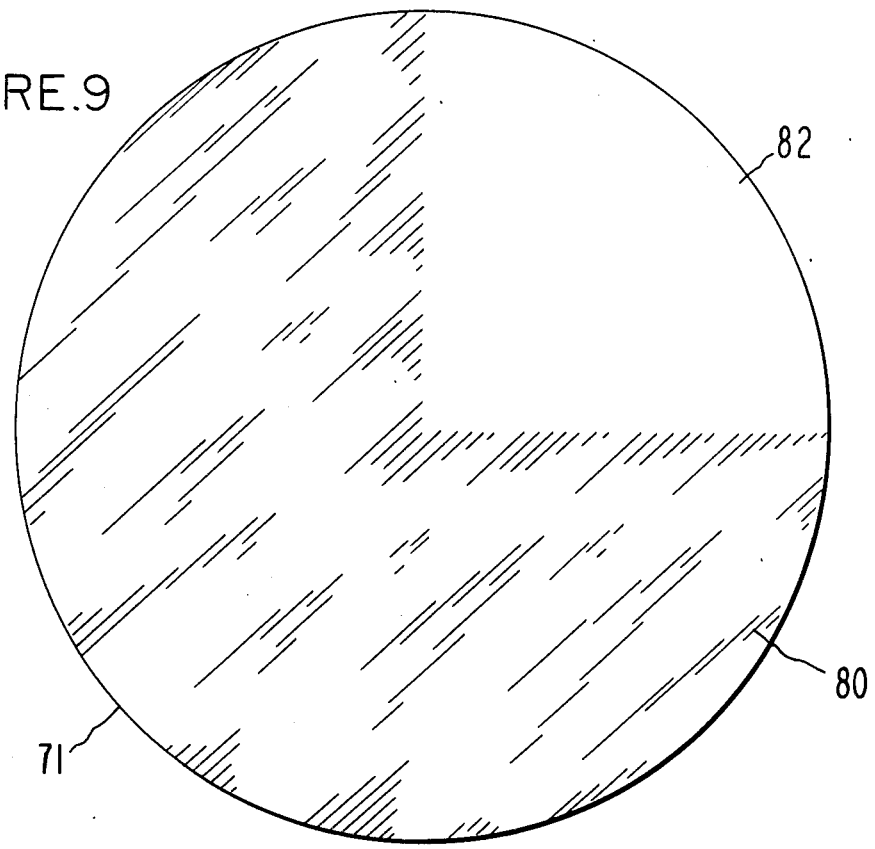
FIG. 9 shows the diaphragm used in the apparatus shown in FIG. 7.

The apparatus shown in FIG. 7 may alternatively be used with the diaphragm 71 shown in FIG. 9 to allow selective exposure of a quadrant of wafer 1. The four quadrants of the mask 75 may each contain identical patterns and the diaphragm 71 is rotated, after alignment of a given wafer quadrant, to allow exposure of only that wafer 1 quadrant. This allows alignment of each wafer 1 quadrant to be aligned and exposed independently without requiring rotation of the wafer 1. The diaphragm 71 and the wafer 1 may both be rotated to allow exposure of only a single mask 75 quadrant onto all of the wafer 1 quadrants to avoid the use of a defective mask 75 quadrant.

The apparatus shown in FIG. 7 may be used with rotating diaphragm 71 and wafer 1 to minimize the effects of particular defects in mask 75 and to maximize alignment. Each of the four quadrants of mask 75 contain identical patterns, rotated by 90 degrees. Diaphragm 71 selects one of the four mask 75 quadrants and each of the wafer 1 quadrants is aligned and exposed thereunder for one-sixteenth of the total required exposure time. The diaphragm 71 is then rotated to the next mask 75 quadrant and each of the four wafer 1 quadrants is then aligned and exposed thereunder.

The apparatus shown in FIG. 7 may also be used to facilitate exposure of different wafer 1 levels without the need for installation of a different mask in frame 77 for each level. Each of the four quadrants of mask 75 contains a pattern for a different level of wafer 1. Diaphragm 71 is used to select a particular mask 75 quadrant and each of the four wafer 1 quadrants is aligned and exposed with that mask 75 quadrant. The wafer 1 may then be removed and processed and prepared for the next exposure step. The mask 75 quadrant for the next exposure step is then selected by the diaphragm 71 and the four quadrants of wafer 1 are aligned and exposed with the selected mask 75 quadrant.

Figure 11:
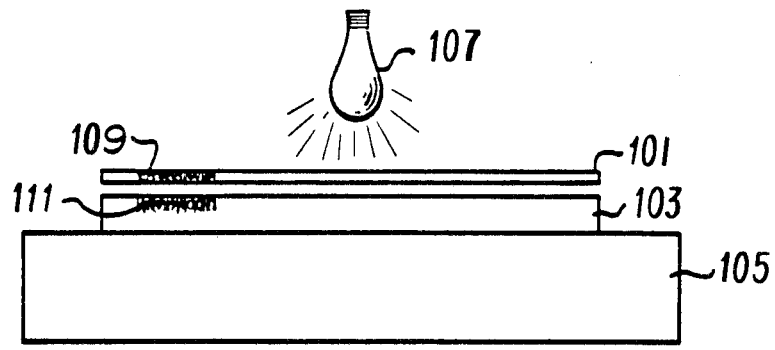
FIG. 11 is a side view of a wafer and mask which are aligned in accordance with the preferred embodiment of the capacitive mask aligner.

FIG. 11 shows a mask 101 aligned with a wafer 103 (mounted on a chuck 105) so that the wafer 103 is irradiated by a source 107 and a desired design is developed on a photoresist coating of wafer 103. Source 107 may generate, for example, visible light or X-rays. Alignment is accomplished by measuring a differential capacitance between a finger region 109 and a wafer array 111.

Figure 12:
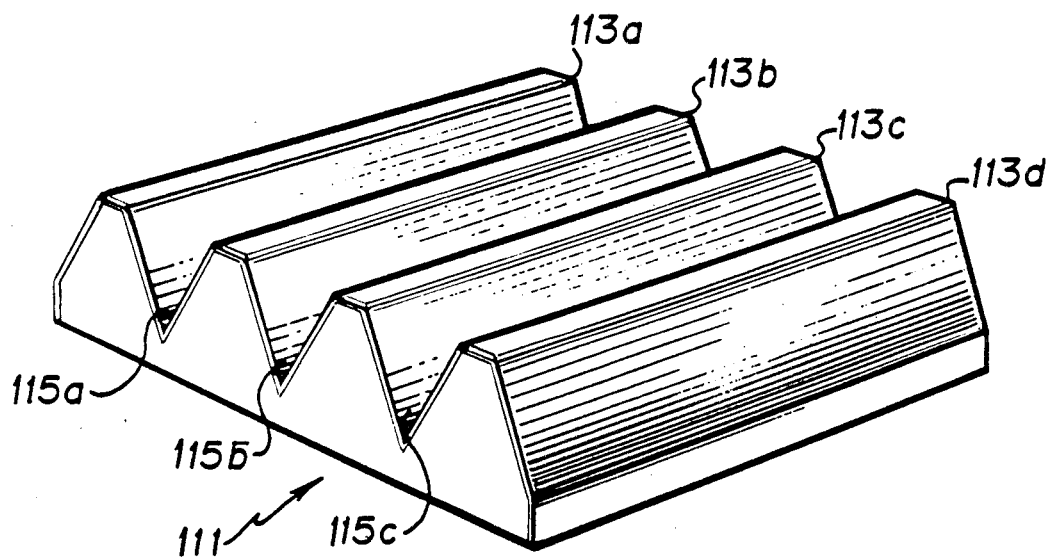
FIG. 12 is a detailed view of the wafer array which is used on the wafer shown in FIG. 11.

FIG. 12 shows a perspective view of a portion of array 111 on wafer 103. Array 111 comprises a series of ridges 113 and valleys 115 which are formed by etching wafer 103. Ridges 113 have a predetermined repetition pattern which may be constant (as shown in FIG. 12) or random or chirped (as shown in FIG. 14B). The wafer 103 is lightly doped so as to have a resistivity on the order of one ohm-centimeter and the ridges 113 and valleys 115 may be coated with a dielectric or conductive layer as required for other processing of the wafer 103 without affecting the performance of the preferred embodiment of the capacitive mask aligner. If wafer 103 comprises silicon having a [100] orientation, than etching of pattern 111 may be performed with KOH. If other silicon orientations or other materials are used for wafer 103, then fabrication of the ridges 113 and valleys 115 may be performed using any of a number of well known orientation dependent etchants. If a GaAs wafer 103 is used, ridges 113 may comprise conductive traces which are deposited upon the insulating GaAs wafer 103. Valleys 115 then comprise the insulating GaAs and air gaps between individual conductive traces.

Figure 13A:
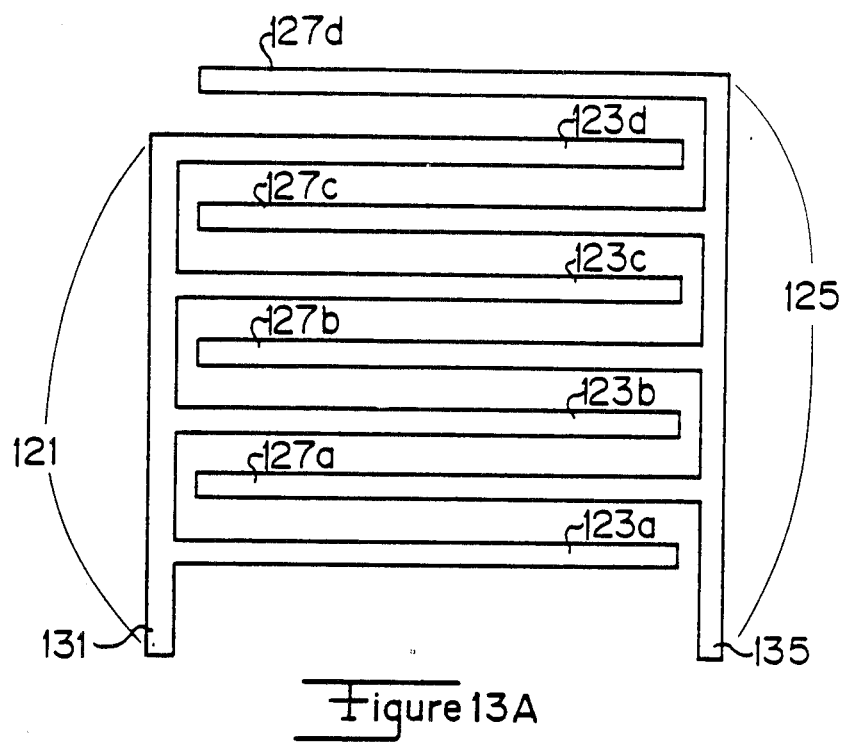
FIGS. 13A-B provide detailed views of the interdigitated fingers which are located on the mask shown in FIG. 11.

FIG. 13A shows a detailed view of hand 121 (including side line 131 and fingers 123) and hand 125 (including side line 135 and fingers 127) of finger region 109. Hands 121 and 125 are fabricated as conductive lines which may be printed or deposited upon mask 101. Side lines 131 and 135 of hands 121 and 125 may extend to the edge of mask 101 to allow for external connections. Fingers 123 and fingers 127 are interdigitated and the repetition patterns of fingers 123, fingers 127 and ridges 113 are substantially identical. The effect of specific locational errors of individual fingers is minimized by the averaging effect over the total number of fingers.

Figure 13B:
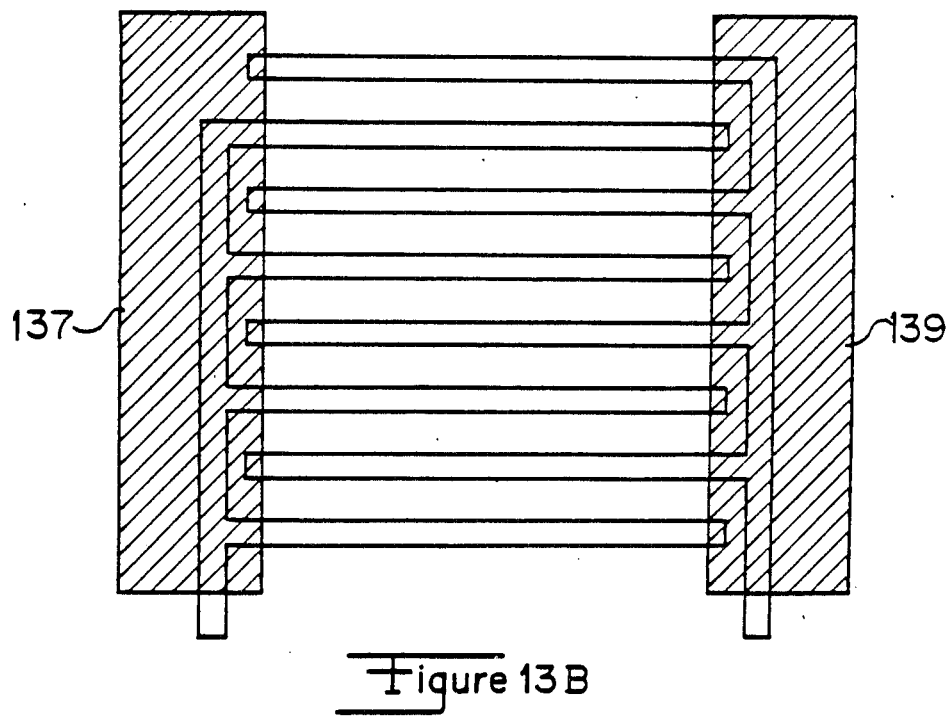

FIG. 13B shows a detailed view of finger region 109 including grounded shields 137, 139. Typically, mask 101 comprises a 3 micron thick boron nitride substrate having a polyimide coating. The hands 121, 125 comprise a gold layer deposited on the polyimide. In order to ensure that capacitive coupling occurs only between ridges 113 and fingers 123, 127 (and not between ridges 113 and side lines 131, 135) grounded shields 137, 139 overlay all side lines 131, 135. Thus, grounded shields 137, 139 are interposed between side lines 131, 135 and wafer 103 to eliminate capacitive coupling between side lines 131, 135 and any portion of wafer 103. Shields 137, 139 may be fabricated by depositing an insulating photoresist layer over hands 121, 125 and than depositing shields 137, 139 as a one micron thick conductuve layer (e.g., aluminum) which is then grounded.

Figure 14A:
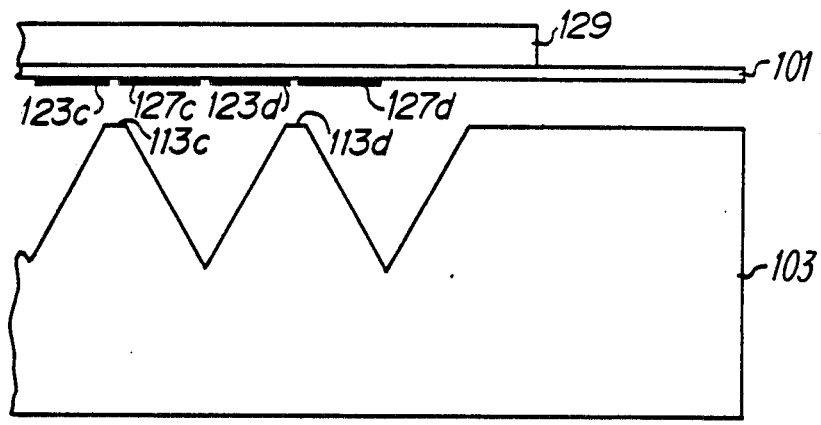
FIGS. 14A-B are exploded side views of the mask and wafer shown in FIG. 11.
Figure 14B:
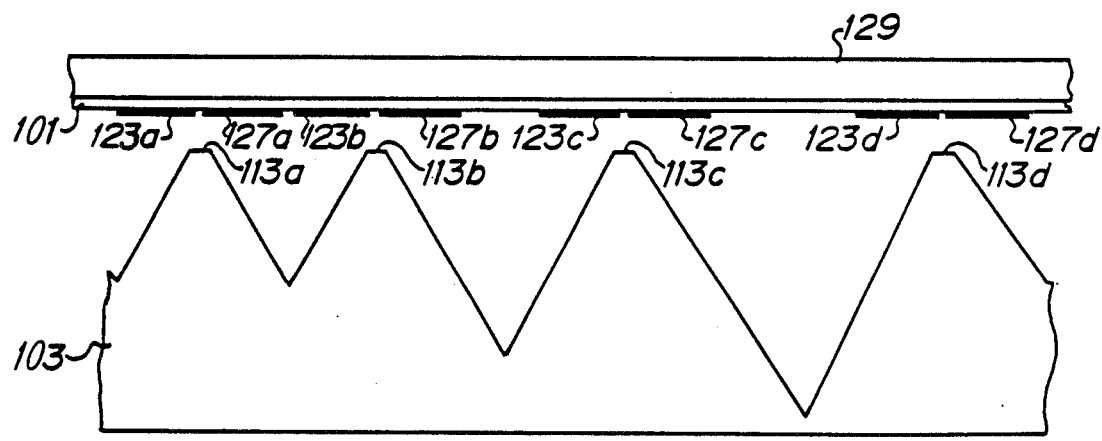

FIG. 14A shows an exploded side view of a portion of mask 101 and wafer 103. The repetition patterns of fingers 123, 127 and ridges 113 are constant and substantially identical. Mask 101 and wafer 103 are in sufficiently close proximity, as is typical in X-ray photolithography, for example, that meaningful capacitive coupling between ridges 113 and fingers 123, 127 occurs. A block 129 may be used to cover finger region 109 on mask 101 so that inadvertent processing of array 111 on wafer 103 does not occur during irradiation of wafer 103. Block 129 may comprise a material which absorbs the radiation generated by source 107.

FIG. 14B shows an exploded side view of a portion of mask 101 and wafer 103 in which the repetition patterns of the ridges 113 and fingers 123, 127 are chirped in spatial frequency. If the repetition patterns of fingers 123, 127 and ridges 113 are substantially identical and aperiodic there will be one unique position at which the ridges 113 are centered between pairs of fingers 123, 127. This permits determination of a single unique alignment. It should be noted that a unique alignment may also be obtained by using identical repetition patterns which are random.

Figure 15:
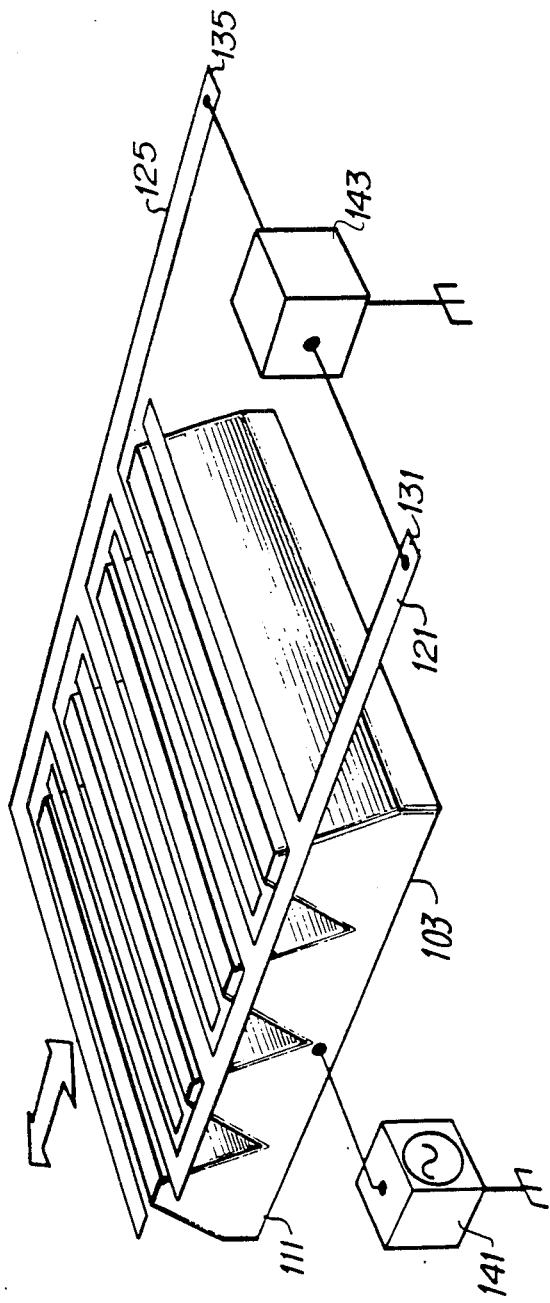
FIG. 15 is a perspective view of the preferred embodiment of the capacitive mask aligner.

FIG. 15 shows a perspective view of the preferred embodiment of the capacitive mask aligner including finger region 109 and array 111 shown in FIGS. 11-14. For the sake of illustrative clarity, mask 101 itself and the remainder of wafer 103 outside of array 111 are not shown in FIG. 15. An oscillator 141 is connected to one side of wafer 103 and an opposite side is grounded. Oscillator 141 impresses a sine wave or other signal across array 111. Side lines 131, 135 of hands 121, 125 are connected to a detector 143 which compares the air coupled capacitance of ridges 113 to fingers 123 and the air coupled capacitance of ridges 113 to fingers 127. Detector 143 may, for example, measure a relative signal amplitude or a relative signal phase.

Figure 16:
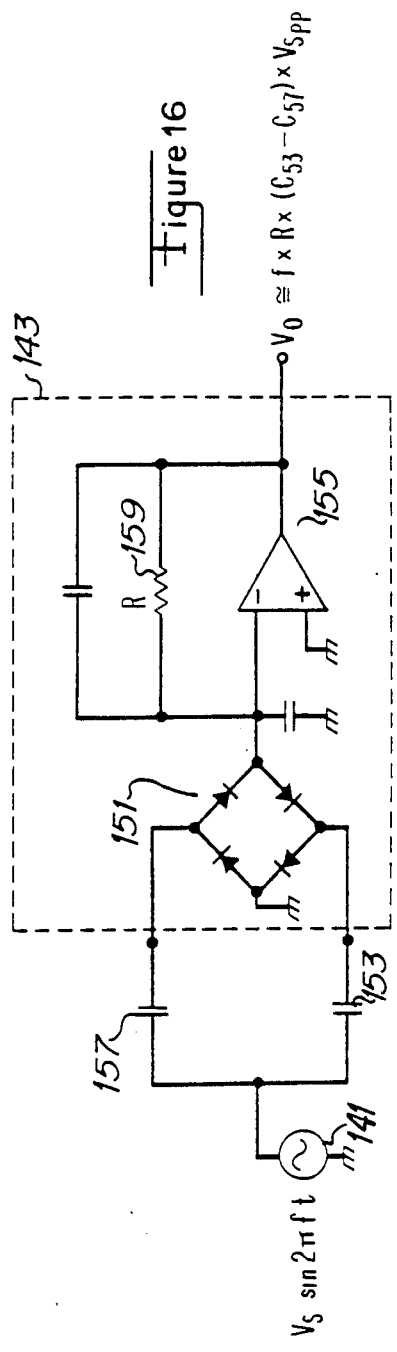
FIG. 16 is a schematic diagram of the detector shown in FIG. 15.

FIG. 16 is a schematic diagram of the detector 143 shown in FIG. 15 which is operative for measuring a relative signal amplitude. Capacitors 153 and 157 represent the capacitive coupling between ridges 113 and fingers 123 and 127, respectively. Bridge 151, comprising matched Schottky barrier diodes, rectifies the signals coupled by capacitors 153, 157 and applies them to amplifier 155 which utilizes a feedback resistor (R) 159. The output of detector 143 is proportional to the difference in capacitance of capacitors 153 and 157 and the output (Vo) is zero when the two capacitances are equal.

An aligner incorporating the preferred embodiment of the capacitive mask aligner shown in FIGS. 11-16 has been used in conjunction with X-ray lithography to allow fabrication of one micron wide lines on a silicon wafer. [100] orientation silicon was used and KOH was utilized as the orientation dependent etchant to create ridges 113 and valleys 115 on wafer 103. The gap between mask 101 and wafer 103 was 30 microns. Array 111 on wafer 103 was 3 by 3 millimeters in size although the size and location of array 111 may be varied as dictated by the particular geometry of the wafer being fabricated. The valleys 115 were approximately 80 microns deep, the tops of ridges 113 were 40 microns wide and the repetition pattern had a constant period of 150 microns. The fingers 123, 127 were 60 microns wide and the constant period of the repetition pattern yielded a 15 micron spacing between adjacent fingers. The sine wave output of oscillator 141 was 100 volts peak-to-peak at 500 KHz.

Using the above-described X-ray lighography aligner, it was found that a 0.07 micron misalignment of mask 101 and wafer 103 created a measurable capacitance differential of approximately 0.28 femtofarad. The relationship between misalignment and capacitance differential was linear since capacitance is inversely proportional to distance. In FIG. 15, the output of detector 143 was zero when each of ridges 113 was centered between a finger 123 and a finger 127. When centering occurred the distances beween each of ridges 113 and the nearest fingers 123, 127 were equal and, hence, the capacitances were equal. Since multiple fingers on each of hands 121, 125 were used, individual errors were averaged. When relative movement of mask 101 and wafer 103 occurred, as shown by the arrow in FIG. 15, one capacitance increased while the other decreased and the output of detector 143 deviated from zero. It should be noted that shields 137, 139 shown in FIG. 13B ensured that relative movement in a direction orthogonal to the arrow shown in FIG. 15 did not produce a change in the differential capacitances or a deviation in the output of detector 143. For optimal alignment sensitivity it was found that the period of the repetition pattern should be roughly 5 to 6 times the size of the gap.

Figure 17:
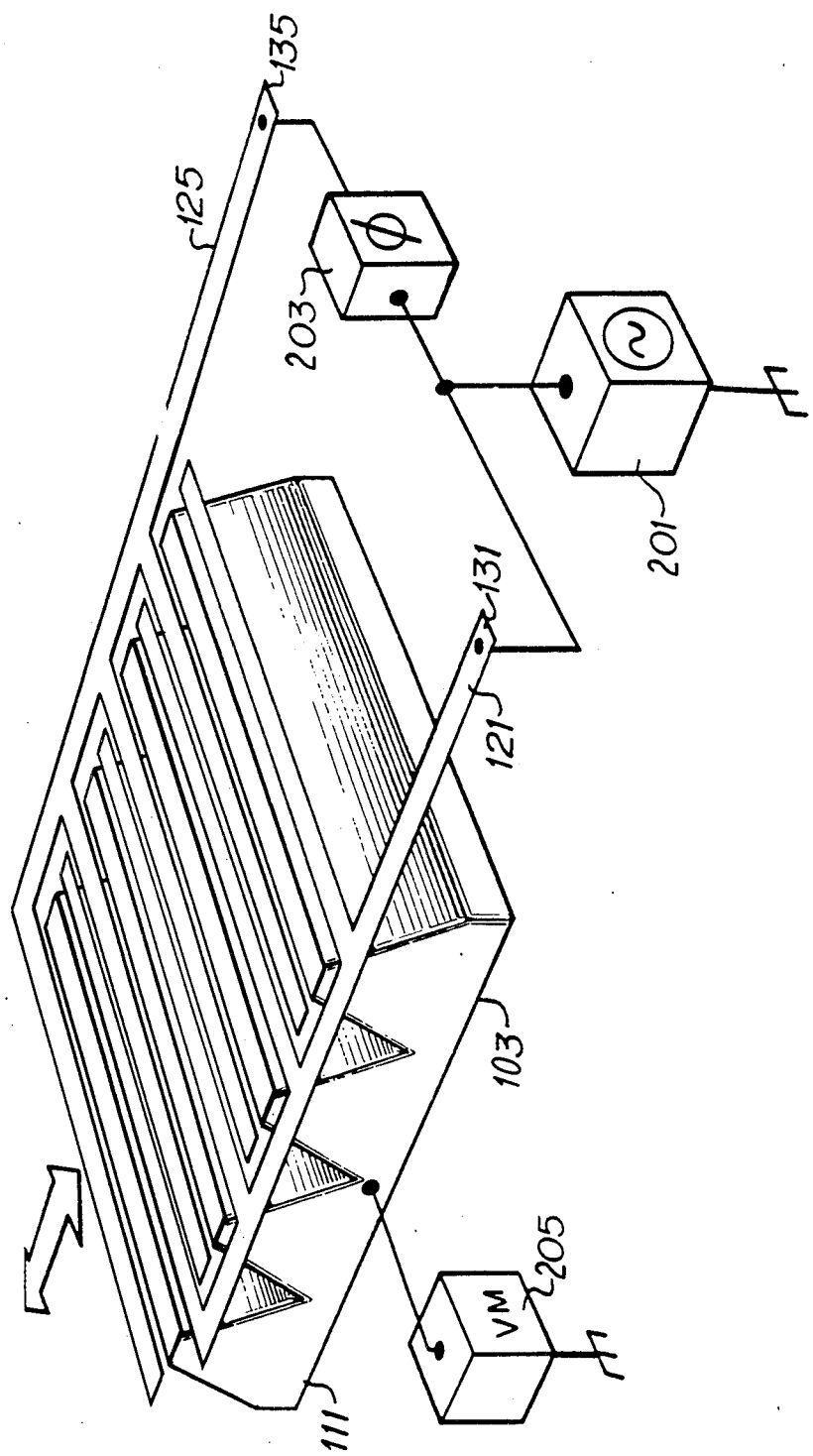
FIG. 17 is a perspective view of another preferred embodiment of the capacitive mask aligner in which the mask is driven with a signal.

FIG. 17 shows an aligner which is constructed in accordance with another preferred embodiment of the capacitive mask aligner with which alignment may be performed without applying a high voltage to wafer 103. An oscillator 201 provides a sine wave signal to side line 131 and to a nonattenuating phase shifter 203. The phase shifter 203 provides a sine wave signal to side line 135 which is of the same amplitude and frequency as the signal applied to side line 131 but which is phase shifted by 180 degrees. In order that the two signals have identical amplitudes and opposite phases, a Blumlein transformer may be used in place of the phase shifter 203. The Blumlein transformer, which is well known to persons of ordinary skill in the art, provides two outputs having identical amplitudes and opposite phases. The two outputs may be coupled to side lines 131 and 135, respectively. A voltmeter 205 detects a summation of the two signals which are coupled to wafer 103. When alignment is achieved the shifted and unshifted signals are coupled equally to wafer 103, the two signals cancel and a null is detected by voltmeter 205. Time or frequency multiplexing may be used if more than one aligner is utilized on a single wafer 103.

Figure 18:
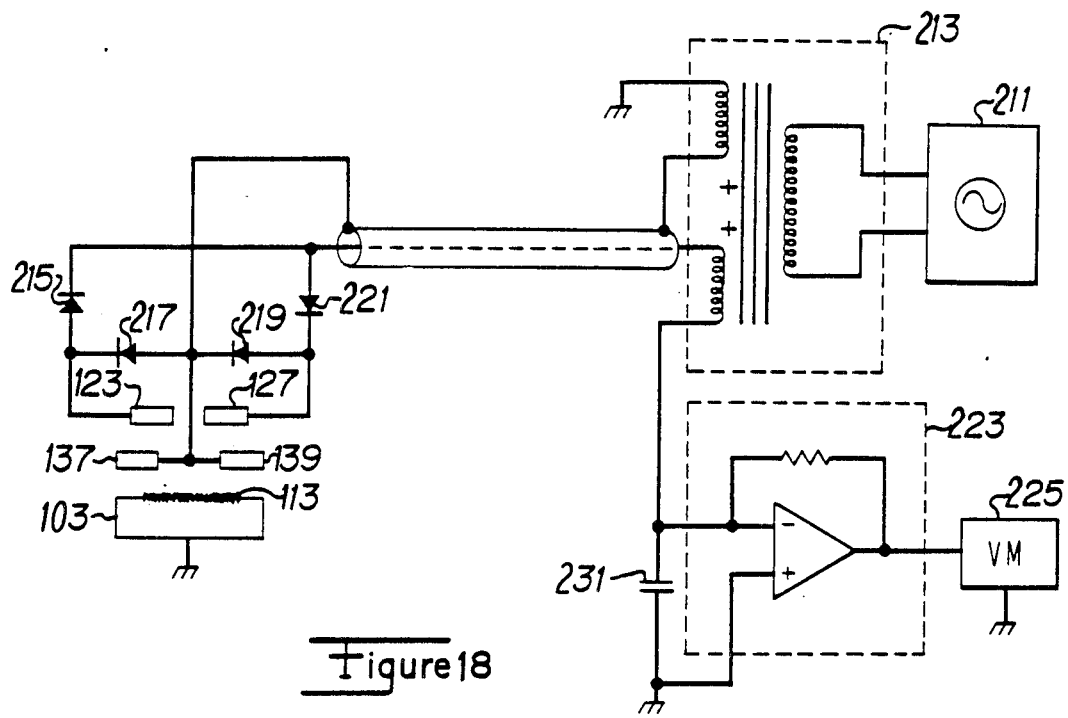
FIG. 18 is a schematic diagram of another preferred embodiment of the capacitive mask aligner in which the wafer is grounded.

FIG. 18 shows an aligner which is constructed in accordance with another preferred embodiment of the capacitive mask aligner with which alignment may be performed with wafer 103 grounded. A transformer 213 having matched windings provides a sine wave from driver 211 to fingers 123, 127 and to shields 137, 139 (shown in FIG. 13B) at the same amplitude. The aligner shown in FIG. 18 may be viewed as having an air gap capacitor (C1) between ridges 113 and fingers 127, and another air gap capacitor (C2) between ridges 113 and fingers 123. Charge is delivered to capacitor C1 from storage capacitor 231 during the positive portions of the sine wave and is returned to storage capacitor 231 from capacitor C2 during the negative portions. Any difference in capacitance between capacitors C1 and C2 (caused by misalignment) causes a net D.C. voltage across storage capacitor 231 which is detected by amplifier 223 and voltmeter 225. A null occurs when alignment is achieved.

Figure 19:
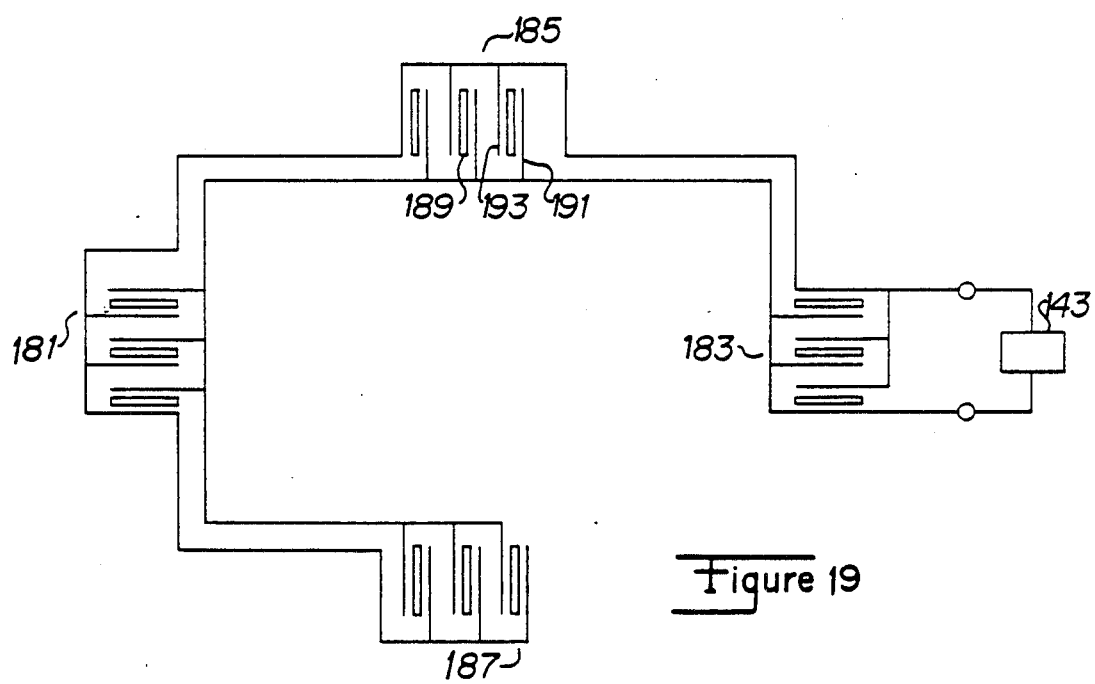
FIG. 19 shows a rotational aligner which uses four aligners which are constructed in accordance with the preferred embodiment of the capacitive mask aligner shown in FIG. 15.

FIG. 19 shows a rotational aligner which is constructed in accordance with another preferred embodiment of the capacitive mask aligner. Since the aligner shown in FIG. 15 does not provide alignment sensitivity in a direction which is orthogonal to the arrow depicted in FIG. 15 it is necessary to use two mutually orthogonal sets of ridges and fingers to provide simultaneous alignment in both an "x" and a "y" direction. Further, if four sets of ridge/fingers 181, 183, 185, 187 are used as shown in FIG. 19, rotational misalignment of 10 to 20 microradians can be detected and corrected. For the sake of illustrative clarity, only twelve ridges 189 and twenty-four fingers 191, 193 are shown while in reality the number will be dependent upon the space available and ridges 189 and fingers 191, 193 will be similar to ridges 113 and fingers 123, 127 shown in FIGS. 12-15. Shields as discussed above with reference to FIG. 13B should be used to avoid misalignment caused by unwanted capacitive coupling.

Figure 10:
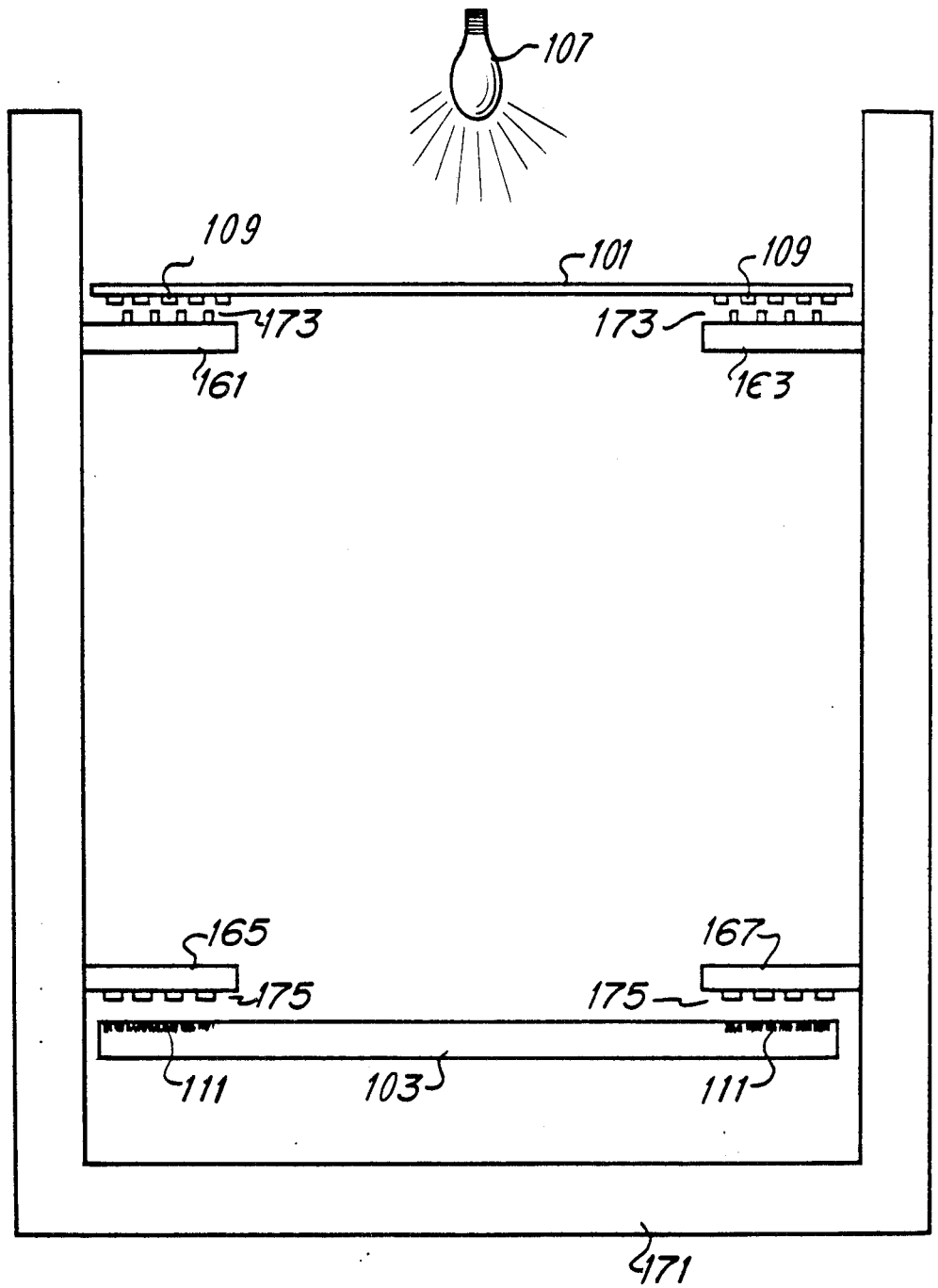
FIG. 10 is a side view of another preferred embodiment of the capacitive mask aligner in which the mask and the wafer are separated by a substantial distance.

FIG. 10 shows another preferred embodiment of the capacitive mask aligner in which a mask 101 and a wafer 103 are spaced a substantial distance apart as is required by various optical lithography methods. Thus, the capacitance between mask 101 and wafer 103 cannot easily be measured. Instead, a rigid backbone 171 is equipped with two upper reference ledges 161, 163 and two lower reference ledges 165, 167 which are initially aligned together to provide a benchmark. Ledges 161, 163 include conductive ridges 173 which perform the same functions as do ridges 113 in FIG. 12. Thus, mask 101 can easily be aligned to ledges 161, 163 in the manner discussed above with reference to FIGS. 11-16 by driving ridges 173 with oscillator 141 and connecting detector 143 to finger region 109. In a like manner, ledges 165, 167 include fingers 175 and mask 101 can be aligned to ledges 165, 167 by driving wafer 103 with oscillator 141 and connecting detector 143 to fingers 175. Thus, alignment can be achieved without requiring that mask 101 be in close proximity with wafer 103.

We claim:

1. An apparatus for lithographically exposing a surface, the apparatus comprising:
   source means for emitting radiation;
   a mask, located between the source means and the surface, the mask being divided into a plurality of radial sectors with each radial sector having a desired pattern thereon;
   support means for supporting the surface;
   a diaphragm, located between the mask and the source means, the diaphragm comprising a nontransmissive portion and a transmissive portion, the transmissive portion being substantially identical to, and aligned with, a radial sector of the mask; and
   rotation means, attached to the diaphragm, for rotating the diaphragm so that the transmissive portion is aligned with a desired radial section of the surface,
   wherein the surface is divided into a plurality of radial sectors.

2. An apparatus as in claim 1, further comprising alignment means, coupled to the mask and to the surface, for aligning a radial sector of the mask with a radial sector of the surface.

3. An apparatus as in claim 1, wherein:
   the number of radial sectors is four;
   the desired patterns on each of the mask radial sectors are identical; and
   the rotation means is operative for rotating the diaphragm in 90 degree increments.

4. An apparatus as in claim 3, wherein the surface comprises a surface of a semiconductor wafer.

5. An apparatus as in claim 4, wherein the source means is an X-ray source.

6. An apparatus as in claim 5, wherein the support means is further operative for rotating the wafer in 90 degree increments.

7. An apparatus as in claim 6, wherein the desired patterns on each of the mask radial sectors are identical, but rotated by 90 degrees.

8. An apparatus as in claim 1, wherein:
   the number of radial sectors is four;
   the desired patterns on each of the mask radial sectors are different; and
   the rotation means is operative for rotating the diaphragm in 90 degree increments.

9. An apparatus as in claim 1, wherein each of the desired patterns on the mask correspond to a different wafer exposure step.

10. A method for lithographically processing a semiconductor wafer, comprising the steps of:
    aligning a first radial sector of the wafer with a first radial sector of a mask;
    blocking radial sectors from radiation exposure, other than the first radial sector, of the wafer with a diaphragm;
    exposing the first radial sector of the wafer to radiation passed through the first radial sector of the mask;
    aligning a second radial sector of the wafer with a second radial sector of the mask;
    rotating the diaphragm and blocking radial sectors, other than the second radial sector, of the wafer, with the diaphragm;
    exposing the second radial sector of the wafer to radiation passed through the second radial sector of the mask; and
    repeating the above steps for remaining radial sectors of the wafer.

11. A method for lithographically processing a semiconductor wafer, comprising the steps of:
    aligning a first radial sector of the wafer with a first radial sector of a mask;

blocking radial sectors from radiation exposure, other than the first radial sector, of the wafer with a diaphragm;

exposing the first radial sector of the wafer through the first radial sector of the mask;

rotating the wafer;

aligning the first radial sector of the wafer with a second radial sector of the mask;

exposing the first radial sector of the wafer to radiation passed through the second radial sector of the mask;

repeating the above steps until the first radial sector of the wafer is exposed through all of the radial sectors of the mask;

aligning a second radial sector of the wafer with the first radial sector of the mask;

rotating the diaphragm;

blocking radial sectors from radiation exposure, other than the second radial sector, of the wafer, with the diaphragm;

exposing the second radial sector of the wafer to radiation passed through the first radial sector of the mask;

rotating the wafer;

aligning the second radial sector of the wafer with the second radial sector of the mask;

exposing the second radial sector of the wafer to radiation passed through the second radial sector of the mask;

repeating the above five steps until the second radial sector of the wafer is exposed through all of the radial sectors of the mask; and repeating the above steps until all of the radial sectors of the wafer are exposed through all of the radial sectors of the mask.

12. Apparatus as defined in claim 1 further including means for rotating said surface relative to said mask.

13. Apparatus for lithographic exposure of a workpiece surface, comprising:

source means for emitting radiation;

a mask located between the source means and the surface, the mask being divided into a plurality of radial sectors, at least two of the radial sectors having a desired pattern thereon;

support means for supporting the workpiece surface;

a diaphragm, located between the source means and the mask, the diaphragm comprising a non-transmissive portion for blocking radiation from the source means and a transmissive portion for illuminating a selected radial sector of the mask with radiation from the source means;

first rotation means for causing relative rotation between the diaphragm and the mask such that the selected radial sector of the mask can be registered with the transmissive portion of the diaphragm; and alignment means for aligning the selected radial sector of the mask with a radial section of the workpiece surface.

14. Apparatus as defined in claim 13 wherein said desired patterns on said radial sectors of the mask are the same.

15. Apparatus as defined in claim 13 further including second rotation means for causing relative rotation between the mask and the workpiece surface such that the selected radial sector of the mask can be registered with a selected radial section of the workpiece surface.

16. Apparatus as defined in claim 15 wherein said desired patterns on said radial sectors of the mask are the same and in operation the selected radial section of the workpiece surface is exposed through more than one mask radial sector such that the deleterious effects of mask defects are reduced.

17. Apparatus as defined in claim 15 wherein said desired patterns on said radial sectors of the mask are different and in operation the selected radial section of the workpiece surface is exposed through more than one mask radial sector such that different desired patterns can be exposed with a single mask.

18. Apparatus as defined in claim 13 wherein said alignment means is a capacitive mask aligner.

* * * * *